(12) United States Patent
Endo et al.

(10) Patent No.: US 11,675,031 B2
(45) Date of Patent: Jun. 13, 2023

(54) SYSTEM FOR CENTERING A SAMPLE TUBE FOR USE WITH AN NMR MEASUREMENT SYSTEM AND SAMPLE TUBE CENTERING METHOD

(71) Applicant: JEOL Ltd., Tokyo (JP)

(72) Inventors: Yuki Endo, Tokyo (JP); Yutaka Horino, Tokyo (JP); Naohiro Kosaka, Tokyo (JP); Atsuyuki Ichikawa, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 17/190,540

(22) Filed: Mar. 3, 2021

(65) Prior Publication Data

US 2021/0278487 A1    Sep. 9, 2021

(30) Foreign Application Priority Data

Mar. 5, 2020   (JP) .............................. JP2020-038266

(51) Int. Cl.
*G01R 33/30*    (2006.01)

(52) U.S. Cl.
CPC .................................. *G01R 33/307* (2013.01)

(58) Field of Classification Search
CPC ................................................... G01R 33/307
See application file for complete search history.

(56) References Cited

U.S. PATENT DOCUMENTS

| 4,088,944 A * | 5/1978 | Engler ................. G01R 33/307 324/321 |
| 4,806,868 A * | 2/1989 | Schulke ............... G01R 33/307 324/321 |
| 4,859,949 A | 8/1989 | McKenna |
| 5,146,166 A | 9/1992 | Bartuska |
| 5,644,235 A * | 7/1997 | Baltusis ............... G01R 33/307 324/322 |
| 2002/0196022 A1 | 12/2002 | Tschirky et al. |
| 2014/0251033 A1 | 9/2014 | Unno |
| 2015/0002152 A1 | 1/2015 | Schmidig et al. |

FOREIGN PATENT DOCUMENTS

| JP | S5149780 | 4/1976 |
| JP | S5474795 A | 6/1979 |
| JP | S54119287 A | 9/1979 |
| JP | 5566742 A | 5/1980 |
| JP | 60137360 U | 9/1985 |
| JP | H09101272 A | 4/1997 |
| JP | 2002311118 A | 10/2002 |
| JP | 2007315886 A | 12/2007 |

OTHER PUBLICATIONS

Extended European Search Report issued in EP21160050.7 dated Jul. 9, 2021.
Office Action issued in JP2020-038266 dated Feb. 1, 2022.
Office Action issued in EP21160050.7 dated Jul. 12, 2022.

\* cited by examiner

*Primary Examiner* — Jay Patidar
(74) *Attorney, Agent, or Firm* — The Webb Law Firm

(57) ABSTRACT

A rotation mechanism includes a bearing mechanism and a drive mechanism. Prior to loading of a sample unit, bearing gas is supplied to a bearing mechanism. In the course of inserting the sample unit, bearing gas is sprayed to a surface of the sample tube from around the sample tube to thereby center the sample unit.

6 Claims, 8 Drawing Sheets

SYSTEM FOR CENTERING A SAMPLE TUBE FOR USE WITH AN NMR MEASUREMENT SYSTEM AND SAMPLE TUBE CENTERING METHOD

CROSS REFERENCE TO RELATED APPLICATION

This application claims priority to Japanese Patent Application No. 2020-038266 filed Mar. 5, 2020, the disclosure of which is hereby incorporated by reference in its entirety.

BACKGROUND OF THE INVENTION

Field of the Invention

The present disclosure relates to a Nuclear Magnetic Resonance (NMR) measurement system and a sample tube centering method, and more particularly to controlled operation of a gas bearing.

Description of Related Art

To eliminate or lessen lowering of measurement precision caused by a nonuniform static magnetic field or uneven magnetization in a sample, Nuclear Magnetic Resonance (NMR) measurement systems include an NMR measurement probe having a rotation mechanism. The rotation mechanism holds a sample unit including a sample tube, and applies a rotation drive force to the sample unit. The rotation mechanism typically includes a bearing mechanism that injects bearing gas to the sample unit to hold the sample unit in a non-contact manner, and a drive mechanism that injects drive gas to the sample unit to rotate the sample unit. After the sample unit is positioned in a predetermined measurement position, the bearing mechanism and the drive mechanism start to operate.

Under regulation of floating gas supplied to the sample unit from below, the sample unit is delivered into the NMR measurement probe (loading), or is delivered out of the NMR measurement probe (unloading or ejection). The NMR measurement systems may include an auto-changer adjacent to a static magnetic field generator, to automatically change the sample unit.

JP S54-74795 A and JP S54-119287 A disclose NMR measurement probes including a rotation mechanism having a bearing mechanism and a drive mechanism. These documents, however, nowhere describe the use of the rotation mechanism, particularly the bearing mechanism, during loading of the sample unit.

SUMMARY OF THE INVENTION

Misalignment of a center axis of a sample unit with respect to a predetermined measurement position, specifically, with respect to the center axis of a passage in which the sample unit is inserted and positioned, during loading of the sample unit including a sample tube onto an NMR measurement probe, would impair a spatial relationship between a sample within the sample tube and an NMR detection coil, thereby lowering the NMR measurement precision. Further, misalignment of the sample unit with respect to the center axis of the passage during descending of the sample unit would cause contact or collision of the sample unit with a structural object.

An embodiment of the present disclosure is therefore directed toward correctly aligning a sample unit including a sample tube during loading of the sample unit. Another embodiment of the present disclosure is directed toward using a bearing mechanism that functions during rotation of the sample unit, for aligning the sample unit.

In accordance with an aspect of the disclosure, an NMR measurement system includes a bearing mechanism configured to spray gas toward a passage in which a sample unit including a sample tube is disposed, from around the passage; and a controller configured to operate the bearing mechanism in a loading process of inserting the sample unit into the passage.

In accordance with another aspect of the disclosure, a sample tube centering method includes operating a sample unit including a sample tube to descend along a passage prior to NMR measurement, and during descending of the sample unit, spraying bearing gas to the sample unit to align a center axis of the sample tube with a center axis of the passage.

BRIEF DESCRIPTION OF THE DRAWINGS

Embodiments of the present disclosure will be described by reference to the following figures, wherein.

DESCRIPTION OF THE INVENTION

Figure 1:
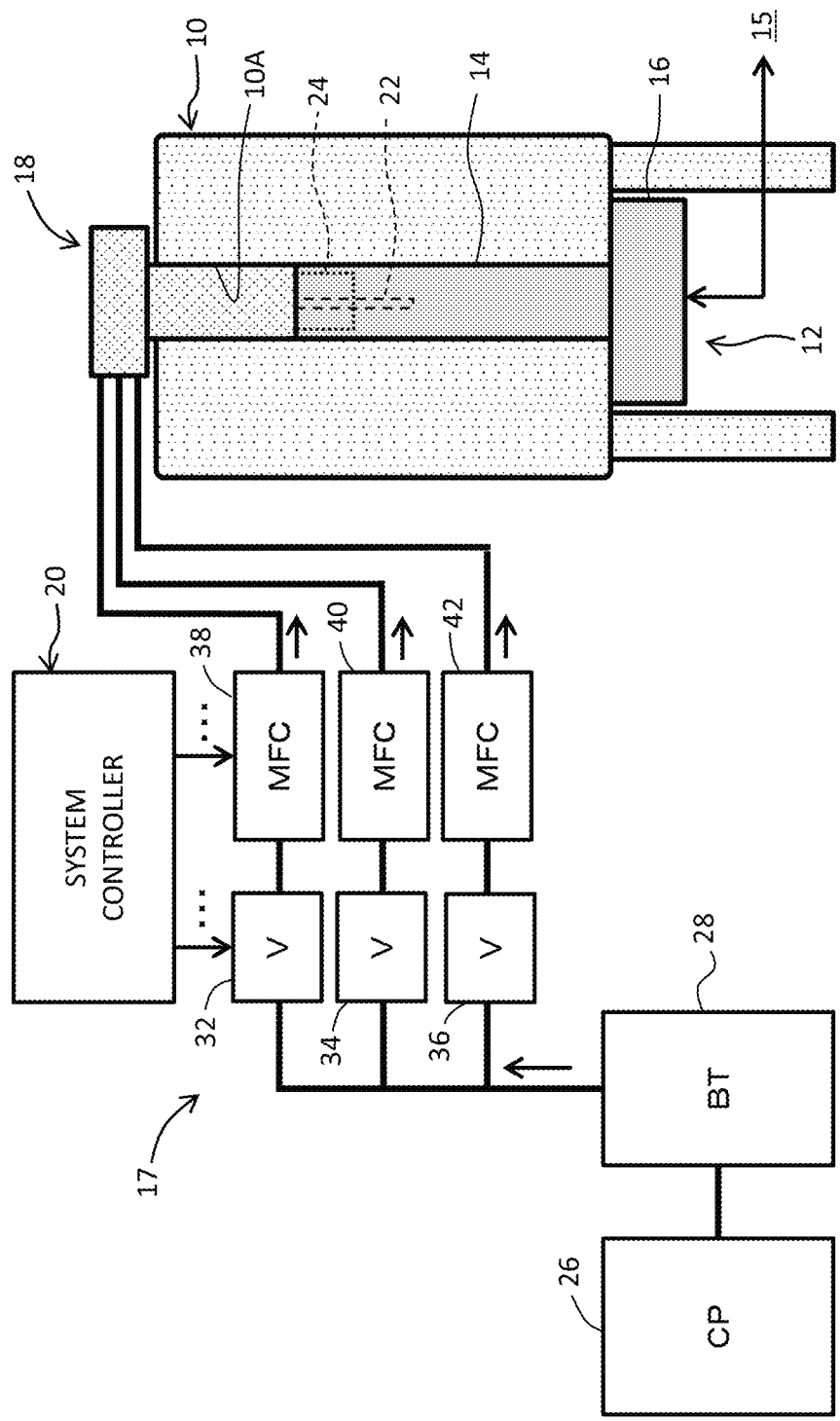
FIG. 1 schematically illustrates an NMR measurement system according an embodiment.

Embodiments will be described below with reference to the drawings.

(1) Summary of Embodiments

An NMR measurement system according to an embodiment includes a bearing mechanism and a controller. The bearing mechanism sprays gas toward a passage in which a sample unit including a sample tube is disposed, from around the passage. The controller operates the bearing mechanism during a loading process in which the sample unit is to be inserted into the passage.

The above configuration enables the bearing mechanism to operate to align the sample unit horizontally during loading of the sample unit. This prevents or reduces lowering of measurement precision caused by an error in alignment of the sample tube. Proper alignment of the sample tube also enables desirable tuning of an electronic circuit including an NMR detection coil, or maintains a desirable tuned state already created. Alignment of the sample unit during descending of the sample tube unit further avoids or lessens contact or collision of the sample tube unit with a structural object.

The bearing mechanism described above is specifically a gas bearing mechanism. The bearing mechanism may include a bearing mechanism that holds a sample unit for rotating the sample unit, or a bearing mechanism for specific use of aligning the sample unit. In the embodiments, the bearing mechanism includes a plurality of bearings arranged vertically. Individual bearings include a plurality of, three or more, for example, openings or gas injection holes, arranged annularly around the passage. During loading, the location and position of the sample unit may be optimized by operating the plurality of bearings.

In the embodiments, the controller includes a processor that executes a program. The controller may include a controller dedicated to control supply of gas and ascending and descending of the sample unit, for example, a controller that controls the NMR measurement system entirely, or other controllers.

The NMR measurement system according to the embodiments include a drive mechanism that applies a rotation driving force to the sample unit. During a non-rotating measurement process after the loading process, the controller operates the bearing mechanism without operating the drive mechanism. This configuration maintains an optimum position of the sample tube during the non-rotating measurement process.

In the embodiments, during a rotating measurement process after the loading process, the controller operates the drive mechanism and the bearing mechanism. Gas may be continuously supplied to the bearing mechanism from the loading process through the rotating measurement process. The operation of the bearing mechanism during an unloading process or an ejecting process, as in the loading process, prevents contact, for example, of the sample unit with a structural object.

In the embodiments, the controller establishes a first flow rate as a flow rate of gas to be supplied to the bearing mechanism in the loading process. Thereafter, in the rotating measurement process, the controller establishes a second flow rate greater than the first flow rate, as a flow rate of gas to be supplied to the bearing mechanism. This configuration optimizes the flow rate in aligning the sample unit and the flow rate in rotating the sample unit.

If it is assumed that a lower end of the descending sample tube unit has an unstable position upon contacting a gas flow formed by the bearing mechanism, the first flow rate is established as a relatively low flow rate. Meanwhile, to stabilize the location and position of the sample tube unit during rotation, the second flow rate is established as a relatively high flow rate.

The flow rate may be dynamically varied during the loading process. While in the embodiments, the bearing mechanism starts to be operated before the loading process, the bearing mechanism may be operated in the middle of the loading process or at the end of the loading process.

In the embodiments, during the loading process, gas is sprayed from a plurality of openings toward the center axis of the sample unit, thereby centering the sample unit. The gas may be sprayed to a surface of the sample tube or to a surface of a member; that is, a cylindrical member, for example, that holds the sample tube.

In the embodiments, the sample unit includes a cap attached to an upper end of the sample tube. The cap includes a first conical surface facing downward. A drive mechanism that applies a rotation drive force to the sample unit is further disposed. The drive mechanism includes a second conical surface facing upward and opposite the first conical surface. The second conical surface includes a plurality of openings through which gas is sprayed to the first conical surface such that the rotation drive force is applied to the first conical surface. Each opening opens toward the direction in which the rotation drive force is applied, which is a tangential direction, for example. While in the embodiments, each conical surface is a slope face having an increasing height from inside toward outside, each conical surface may be a slope face having a decreasing height from inside toward outside.

A sample tube centering method according to an embodiment includes operating a sample unit including a sample tube to descend along a passage prior to NMR measurement, and, during descending of the sample unit, spraying bearing gas to the sample unit to thereby align a center axis of the sample tube with a center axis of the passage. This method enables appropriate alignment of the sample tube prior to the NMR measurement, thereby preventing or reducing lowering of measurement precision caused by positional errors of the sample tube.

A program for controlling each of the above steps is installed in an information processor via a portable storage medium or network. The information processor may conceptually include a controller, a control device, and an NMR measurement system, for example.

In the embodiments, the flow rate of the bearing gas in aligning the center axis of the sample tube with the center axis of the passage and the flow rate of the bearing gas in the NMR measurement are individually established.

(2) Details of Embodiments

FIG. 1 schematically illustrates an NMR measurement system according to an embodiment. The NMR measurement system observes NMR generated in a sample, and produces an NMR spectrum as a result of the observation.

The NMR measurement system includes a static magnetic field generator 10, an NMR measuring probe 12, a spectrometer 15, a gas supply device 17, a sample unit guide 18, and a system controller 20, for example. The static magnetic field generator 10 includes a superconducting magnet, for example, and generates a static magnetic field that is necessary for observation of NMR. The static magnetic field generator 10 includes a bore 10A as a hollow channel.

The NMR measuring probe 12 includes an insertion member 14 to be inserted into the bore 10A, and a base member 16. The insertion member 14 has an upper end that is referred to as a probe head. The probe head contains electronic circuits including an NMR detection coil. The insertion member 14 further includes a rotation mechanism 24 that holds and drives a sample unit 22 including a sample tube, which will be described in detail below. The sample tube contains a liquid sample, for example.

The NMR measurement system has a rotation NMR measurement mode in which NMR is measured with the sample unit 22 being rotated about its center axis, and a non-rotation NMR measurement mode in which NMR is measured without rotating the sample unit 22. While in conventional art, the rotation mechanism 24 functions only in the rotation NMR measurement mode, in the embodiment, the rotation mechanism 24 functions in loading the sample unit both in the rotation NMR measurement mode and in the non-rotation NMR measurement mode.

While the configuration of the spectrometer 15 is not shown, the spectrometer 15 includes a transmission circuit, a reception circuit, and a spectrum generating circuit, for example. Upon receiving a transmission signal supplied from the spectrometer 15, a coil emits electromagnetic wave to a sample, which then generates NMR. The NMR is detected by the coil and a reception signal is generated. The reception signal is transmitted from the NMR measuring probe 12 to the spectrometer 15.

The gas supply device 17 includes a compressor 26, a buffer tank 28, three valves 32, 34, 36, and three mass flow controllers (MFCs) 38, 40, 42. The compressor 27 works to accumulate compressed air within the buffer tank 28. In the downstream of the buffer tank 28, piping is divided into three lines including a first line, a second line, and a third line.

The valve 32 and the MFC 38 are disposed in the first line. Bearing gas is supplied into the static magnetic field generator 10 through the first line. The valve 34 and the MFC 40 are disposed in the second line. Drive gas is supplied into the static magnetic field generator 10 through the second line. The valve 36 and the MFC 42 are disposed in the third line. Eject gas is supplied into the static magnetic field generator 10 through the third line.

Specifically, the bearing gas is supplied to a bearing mechanism included in the rotation mechanism 24. The bearing mechanism is a gas bearing mechanism. The drive gas is supplied to a drive mechanism included in the rotation mechanism 24. The drive mechanism applies a rotation drive force to the sample unit 22 through spraying of gas. The eject gas is used to cause the sample unit 22 to ascend and descend and provide a floating force to the sample unit 22. A pipe for transporting the eject gas may be connected to a lower portion of the bore 10A. The sample unit guide 18 is coupled to an auto-changer which is not shown, to guide, transport, and change the sample unit 22, for example, in cooperation with the auto-changer. The sample unit 22 may be manually changed by an operator.

The system controller 20 controls operation of the components illustrated in FIG. 1. In the embodiments, the system controller 20 specifically controls the operation of the three valves 32, 34, 36 and the three MFCs 38, 40, 42. As described below, the system controller 20 controls the operation of the valve 32 and the MFC 38 to supply the bearing gas to the bearing mechanism, during the loading process in which the sample unit 22 is to be loaded on or inserted into the NMR measuring probe 12. Operating the bearing mechanism during the loading process enables centering of the sample unit 22, particularly, centering of the sample tube. More specifically, the center axis of the sample tube can be aligned with the center axis of the insertion member 14, and more specifically, with the passage center axis including a predetermined location where the sample tube is disposed.

In the embodiments, the flow rate of each gas is actually regulated by the MFCs 38, 40, 42. The system controller 20 outputs flow rate setting values to the MFCs 38, 40, 42. The system controller 20 further controls ON and OFF of the valves 32, 34, 36. The MFCs 38, 40, 42 monitor the flow rates at the outlets while performing feedback control of the flow rates of gas passing therethrough. Each of the three valves 32, 34, 36 is formed of an electromagnetic valve. The flow rate of each gas may be controlled by regulating the opening of the valves.

Figure 2:
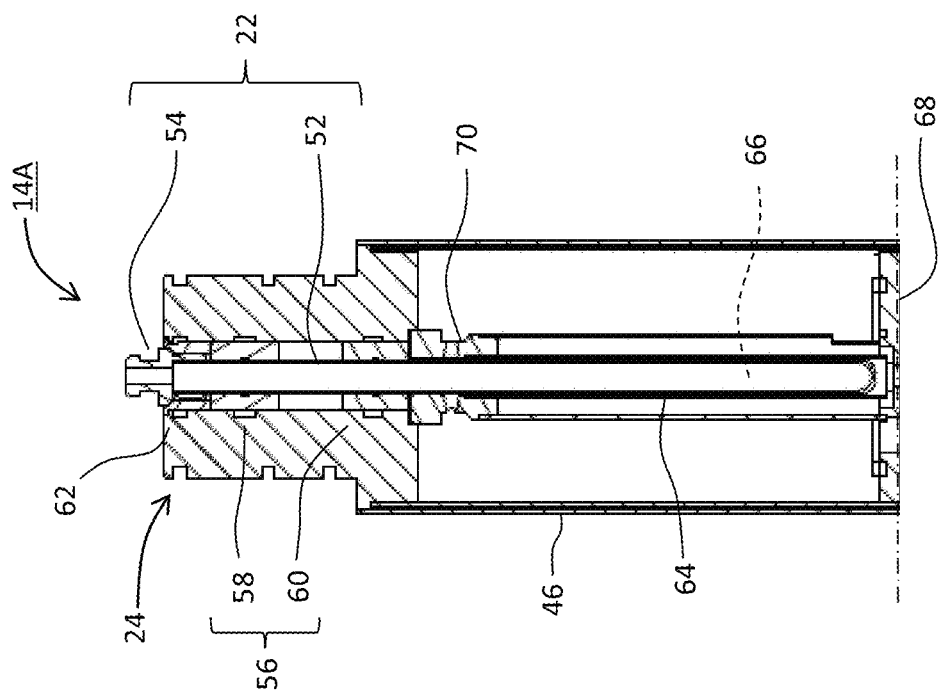
FIG. 2 is a cross section illustrating an NMR measuring probe according to a first embodiment.

FIG. 2 illustrates a configuration of a measurement probe according to a first embodiment. Specifically, FIG. 2 illustrates a cross section of a probe head 14A. The sample unit 22 includes a sample tube 52, and a cap 54 attached to an upper end of the sample tube 52. The sample tube 52 is formed from glass, for example, and the cap 54 is formed from resin, such as polyimide, for example. The sample unit 22 is inserted into and disposed in a passage formed along the center axis in the probe head.

The measurement probe includes a rotation mechanism 24 on top of a container 46 so as to enclose the passage. The rotation mechanism 24 includes a bearing mechanism 56 and a drive mechanism 62. The bearing mechanism 56 may also be referred to as a bearing structure, and the drive mechanism 62 may also be referred to as a drive structure.

The bearing mechanism 56 includes two bearings 58, 60 spaced in the vertical direction in the illustrated example configuration. Each of the bearings 58, 60 is an air bearing including three or more openings annularly arranged. For example, each bearing 58, 60 includes four to eight openings opened toward the center axis of the passage.

The bearing gas is supplied to the bearing mechanism 56. The supplied bearing gas is distributed to the two bearings 58, 60, and is further distributed to the openings of each bearing. This configuration allows the bearing gas to be injected toward the center axis of the passage through the openings formed around the passage. When the sample unit 22 is in the passage, the bearing gas is evenly sprayed to the surface; specifically, the cylindrical surface, of the sample unit 22 from around the surface, thereby holding the sample unit 22 in a non-contacting manner. At this time, the center axis of the sample unit 22 is aligned with the center axis of the passage. In the first embodiment, the bearing gas is sprayed to the sample tube 52. In the second embodiment which will be described later, the bearing gas is sprayed to a member that holds the sample tube. The configuration and operation of the bearing mechanism 56 will be further described by reference to FIGS. 3 and 4.

The drive mechanism 62 applies a rotation drive force to the sample unit 22. Specifically, the drive mechanism 62 injects drive gas to the cap 54 of the sample unit 22, thereby applying the rotation drive force to the sample unit 22. As will be further described by reference to FIG. 3, the cap 54 has a first conical surface or a first tapered face facing downward, similar to a downward face of a top. Meanwhile, the drive mechanism 62 has a second conical surface or a second tapered face facing upward, similar to a mortar or a funnel. The second conical surface includes a plurality of openings for injecting gas in the tangential direction that is a direction orthogonal to the radial direction. The drive gas injected from the drive mechanism 62 through the plurality of openings, with the first conical surface facing the second conical surface, produces a force to rotate the first conical surface. In the embodiment, the drive gas applies some floating force to the sample unit 22. While each conical surface is a slope face having an increasing height from inside toward outside, each conical surface may be a slope face having an increasing height from outside toward inside.

The sample tube 52, which is a container extending along its center axis, contains a liquid sample, which is not shown, within the interior 66 of the sample tube 52. An NMR detection coil 64 is disposed adjacent to a sample storing portion of the sample tube 52. The coil 64 may be any of various coils including a saddle shape coil, for example. A plurality of coils may be disposed. In the illustrated example configuration, the sample unit 22 is held in a non-contact manner with the sample tube 52 floating from a horizontal plate 68 having openings. In a non-rotation NMR measurement mode, the horizontal plate 68 may support the sample unit 22. The measurement probe further includes a relay member 70 under the rotation mechanism 24. The relay member 70 includes a through-hole through which the sample tube 52 passes without contacting the through-hole.

The bearing mechanism 56 and the drive mechanism 62 are formed from resin such as polyimide, ceramic such as zirconia, or metal such as aluminum alloy. Portions of the rotation mechanism 24 that may contact the sample unit 22 are tapered or rounded, for example.

Figure 3:
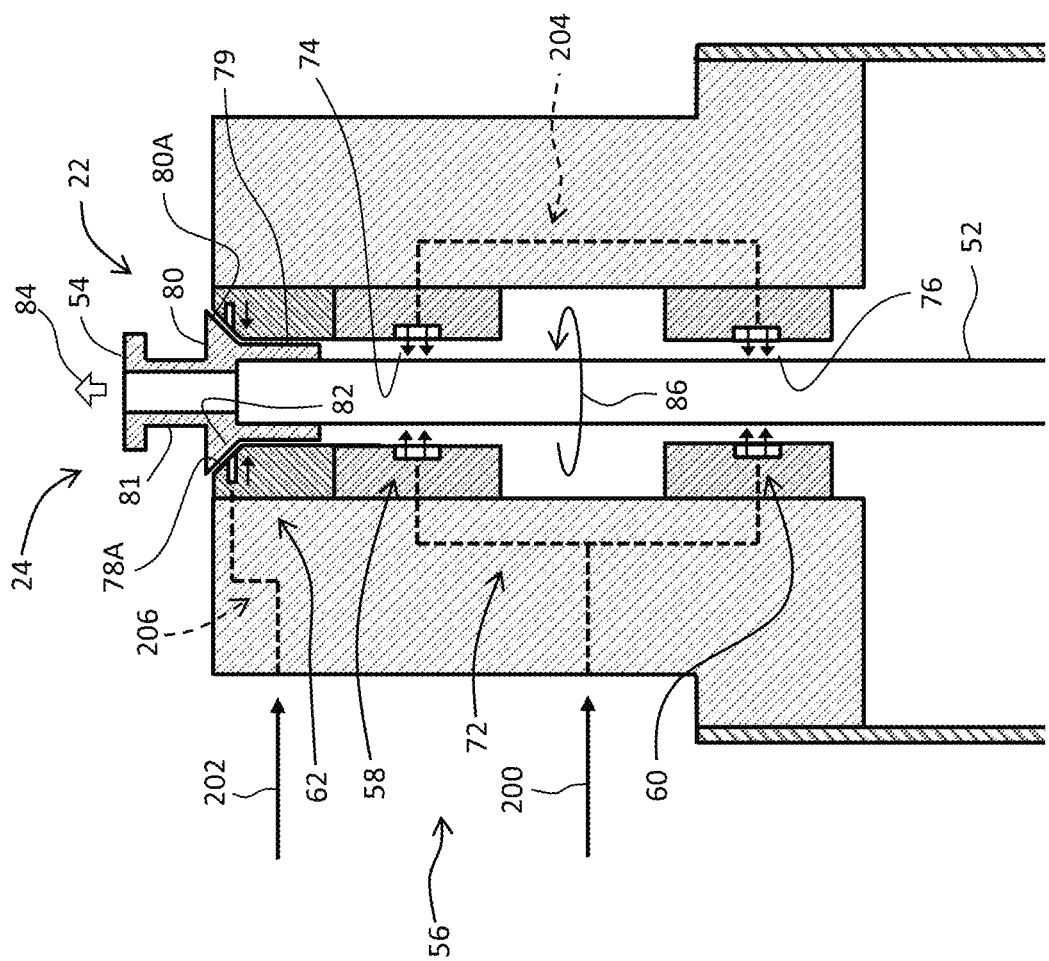
FIG. 3 schematically illustrates operation of a rotation mechanism during an NMR measurement process.

FIG. 3 schematically illustrates the rotation mechanism 24. In FIG. 3, elements corresponding to those illustrated in FIG. 2 are designated with the same reference numerals.

As described above, the sample unit 22 includes the sample tube 52 and the cap 54. The cap 54 includes a cylindrical portion 79 enclosing the upper end portion of the sample tube 52, an overhanging portion 80 disposed on top of the cylindrical portion 79, and a head portion 81 disposed on top of the overhanging portion 80. The lower face of the overhanging portion 80 corresponds to a first conical surface 80A. The head portion 81 is held by a robot or an operator.

As described above, the rotation mechanism 24 includes the bearing mechanism 56 having the two bearings 58 and 60. The bearing 58 disclosed at an upper level has an opening array 74 including a plurality of openings arranged annularly, and the bearing 60 disclosed at a lower level also has an opening array 76 including a plurality of openings arranged annularly. Bearing gas 200 from the gas supply device is supplied to the bearing mechanism 56. The bearing gas 200 is evenly distributed to the plurality of openings forming the opening arrays 74 and 76 (see dashed line 204). The plurality of openings inject the bearing gas toward the center axis of the passage from the radial direction of the passage orthogonal to the center axis of the passage. When the sample tube 52 is placed within the passage, the bearing gas is sprayed to the surface of the sample tube 52 from around the sample tube 52. The eject gas is further sprayed to the sample tube 52 from under the sample tube 52, and the pressure of the eject gas is increased or decreased to thereby cause ascending or descending motion of the sample unit 22 and determine the level at which the sample unit 22 stops.

Drive gas 202 is supplied to the drive mechanism 62 from the gas supply device. The drive mechanism 62 includes a second conical surface 78A facing upward. The second conical surface 78A includes an opening array 82 having a plurality of openings arranged annularly to inject gas tangentially. The drive gas 202 from the gas supply device is distributed to the plurality of openings within the drive mechanism 62 (see reference numeral 206). The drive gas injected through the opening array 82 causes the sample unit 22 to rotate.

Figure 4:
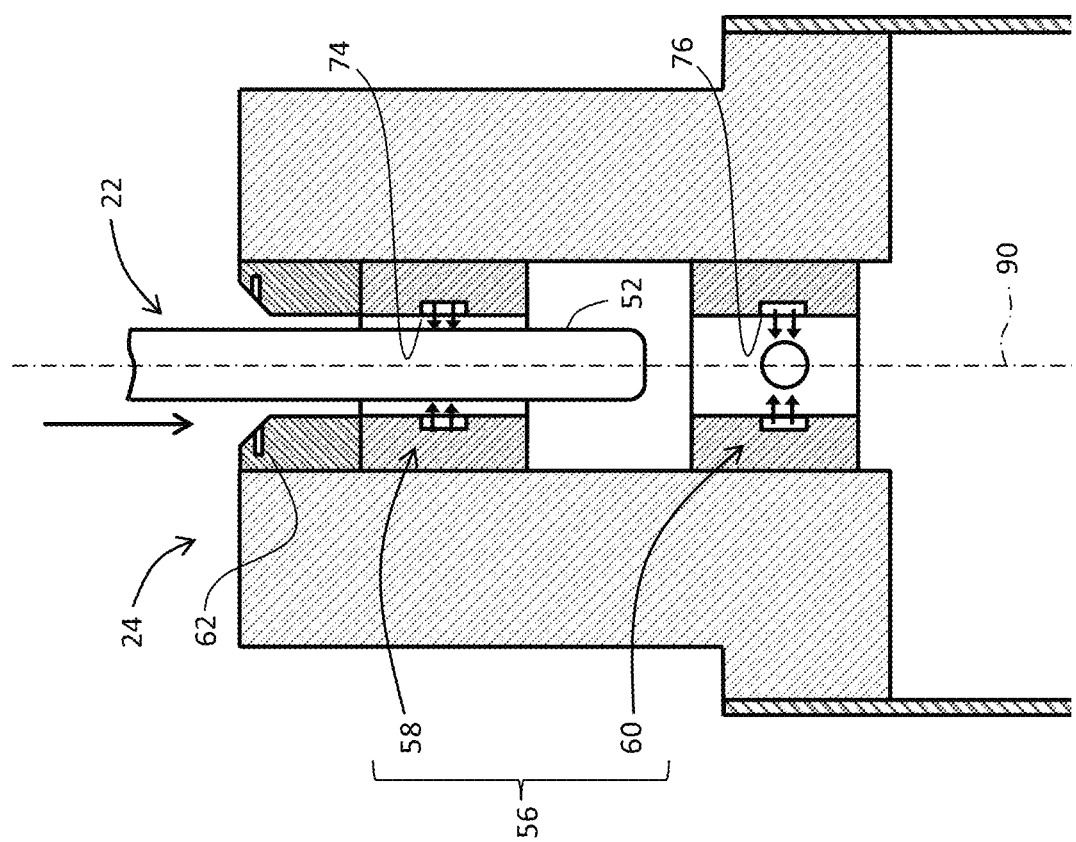
FIG. 4 schematically illustrates operation of the rotation mechanism during a loading process.

FIG. 4 illustrates the sample unit 22 being inserted into the passage; that is, the sample unit 22 in the course of the loading process. With the two bearings 58 and 60 that form the bearing mechanism 56 operating; that is, with the opening arrays 74 and 76 injecting the bearing gas, the sample tube 52 starts a descending motion. When the sample tube 52 reaches the level where the bearing 58 is disposed during the descending motion, the bearing gas from the opening array 74 hits the surface of the sample tube 52, such that the center axis of the sample tube 52 is aligned with the center axis 90 of the passage, and the aligning effect is maintained at the level where the bearing 58 is disposed. When the sample tube 52 further descends to reach the level where the bearing 60 is disposed, the bearing gas from the opening array 76 hits the surface of the sample tube 52, such that the center axis of the sample tube 52 is also aligned with the center axis 90 at this level, and the effect is subsequently maintained.

The sample tube 52 thus horizontally aligned at two points vertically spaced apart has a vertical position. Thus, both the location and position of the sample tube 52 in the horizontal direction are optimized.

In performing the rotation NMR measurement mode after the loading process, the drive mechanism is operated. At this time, the bearing mechanism 56 continues its operation. However, the first flow rate of the bearing gas for loading and the second flow rate of the bearing gas for rotation are determined independently. In the embodiment, the second flow rate is greater than the first flow rate, such that the sample unit 22 is held more firmly and reliably during rotation.

During loading, the operation of the bearing 58 may be started after the lower end of the sample tube 52 passes through the bearing 58. Similarly, the operation of the bearing 60 may be started after the lower end of the sample tube 52 passes through the bearing 60. Alternatively, the operation of the bearings 58 and 60 may be started at the end of the loading process.

Figure 5:
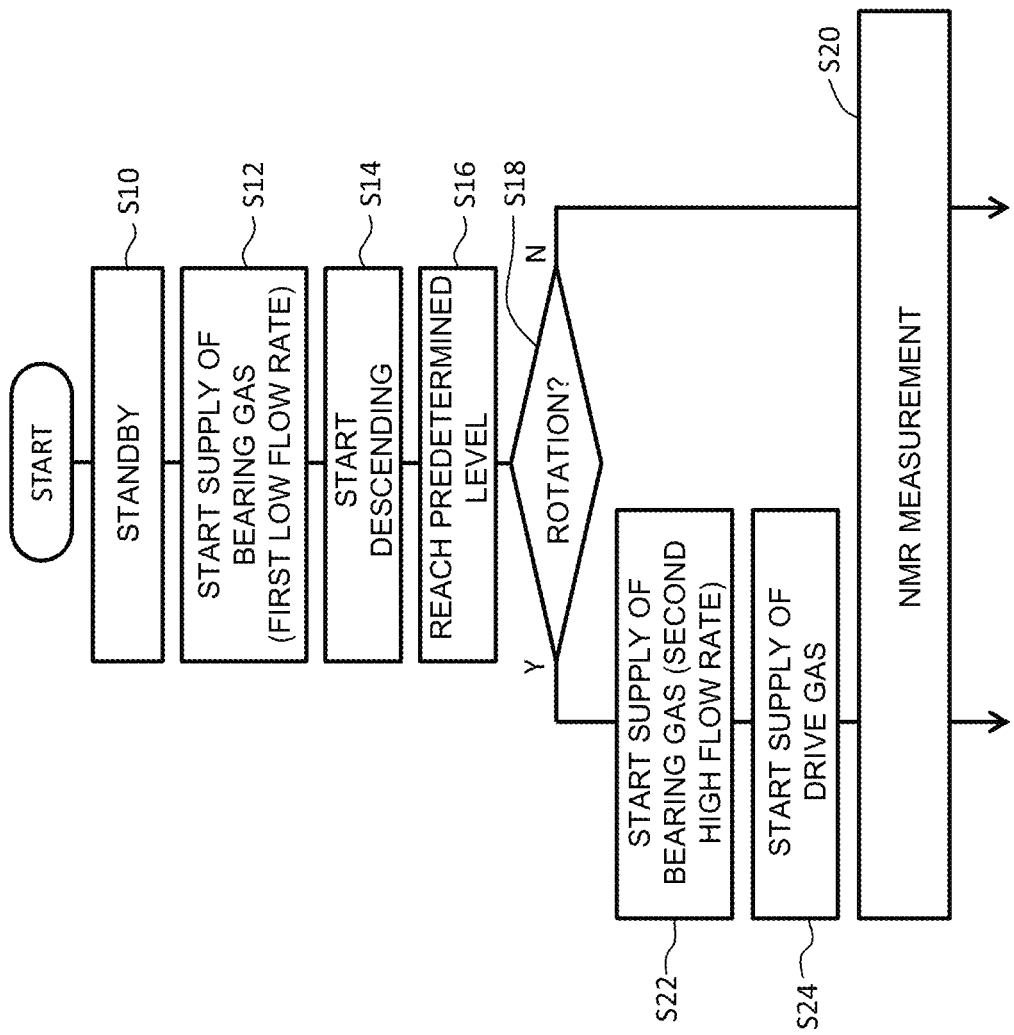
FIG. 5 is a flowchart showing part of operation of the NMR measurement system.
Figure 6:
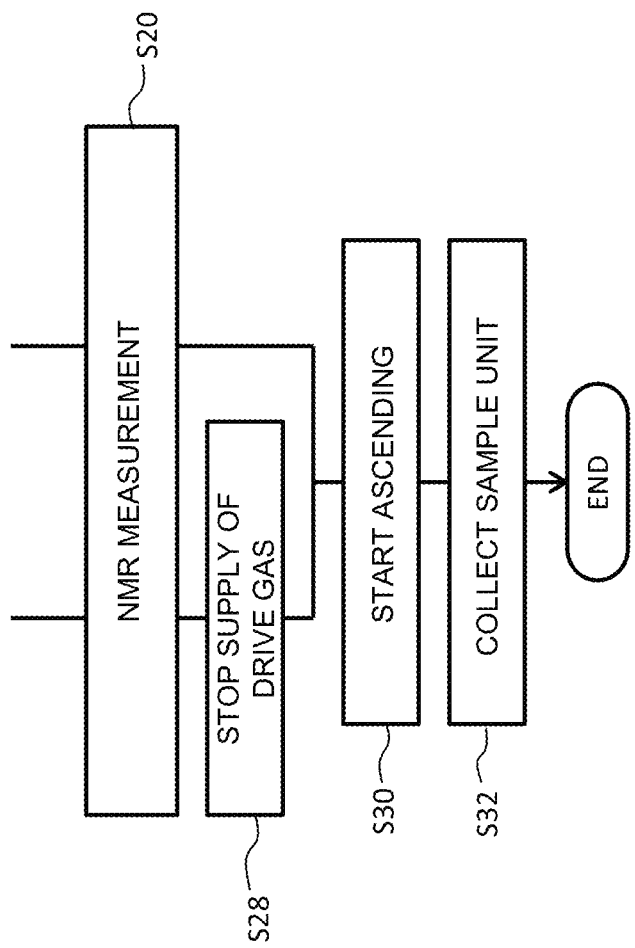
FIG. 6 is a flowchart showing the remaining operation of the NMR measurement system.

FIGS. 5 and 6 show a sample tube centering method and also show the operation of the NMR measurement system illustrated in FIG. 1.

In step S10 in FIG. 5, the sample unit is placed above the NMR measuring probe to establish a standby state. In step S12, supply of the bearing gas to the bearing mechanism starts. At this time, the first flow rate, which is a low flow rate, is established. In step S14, the sample unit starts a descending motion. In step S16, the sample unit reaches a predetermined level and this state is maintained. In loading the sample unit, the bearing gas is sprayed to the sample tube from the bearing mechanism to thereby optimize the location and the position of the sample unit. More specifically, the sample tube is centered.

In step S18, a determination is made as to whether the pre-selected mode is a rotation NMR measurement mode or a non-rotation NMR mode. When the rotation NMR measurement mode is selected, the process in step S20 is executed after the processes in steps S22 and S24 are executed. When the non-rotation NMR measurement mode is selected, the process in step S20 is immediately executed.

In step S22, the flow rate of the bearing gas is changed from the first flow rate, which is a low flow rate, to the second flow rate, which is a high flow rate. In step S24, supply of the drive gas to the drive mechanism starts. In step S20, NMR measurement with respect to the sample is performed. While in the embodiment, supply of the bearing gas stops after the process in step S20 is completed, the supply of the bearing gas may be maintained.

In step S28 in FIG. 6, supply of the drive gas is stopped to thereby stop rotation of the sample unit. In step S30, the sample unit starts an ascending motion, and in step S32, the sample unit which has been ascended is collected.

Figure 7:
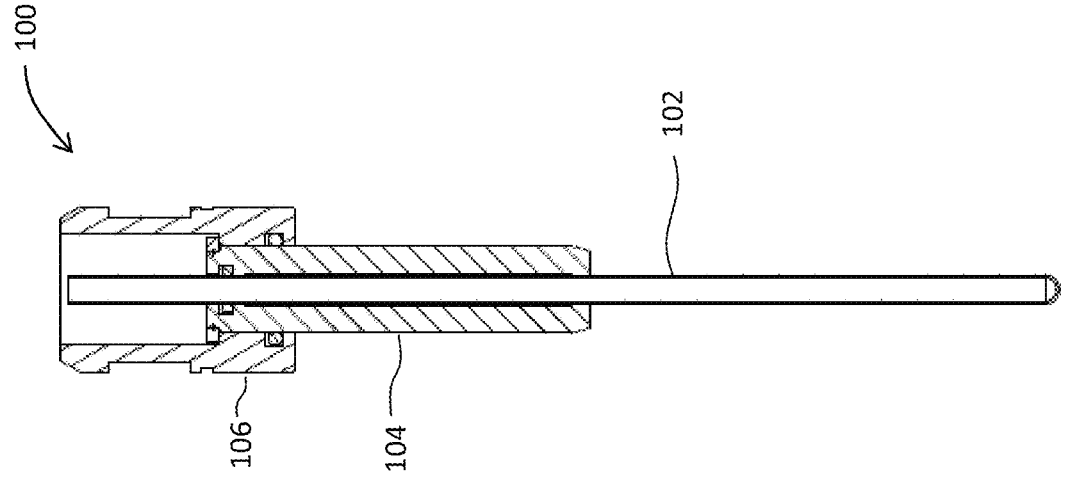
FIG. 7 is a cross section illustrating a sample unit according to a second embodiment.
Figure 8:
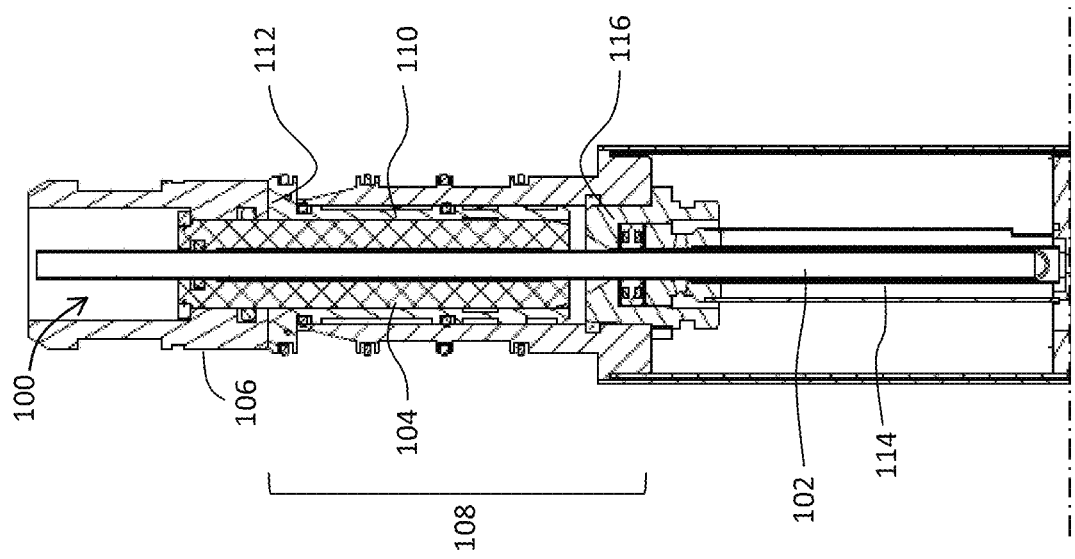
FIG. 8 is a cross section illustrating an NMR measuring probe according to the second embodiment.

FIGS. 7 and 8 illustrate the configurations of a sample unit and an NMR measurement probe, respectively, according to a second embodiment. A sample unit 100 illustrated in FIG. 7 includes a sample tube 102, a holder 104 holding the sample tube 102, and a cover 106 attached to an upper end of the holder 104.

FIG. 8 illustrates the sample unit 100 inserted in a probe head of an NMR measuring probe. A rotation mechanism 108 includes a bearing mechanism 110 and a drive mechanism 112. The rotation mechanism 108 is not shown in detail in FIG. 8. The bearing mechanism 110 includes two bearings spaced apart vertically. Each bearing includes a plurality of openings annularly arranged, through which the bearing gas is injected toward the center axis of a passage. FIG. 8 illustrates a state in which the bearing gas from the plurality of openings is sprayed to a surface of the holder 104 that is a cylindrical member having a cylindrical side face.

The drive mechanism 112 includes a plurality of openings through which the drive gas is sprayed to a bottom face of the cover 106. The drive gas is sprayed to apply a rotation drive force to the sample unit 100. An NMR detection coil 114 is disposed adjacent to the sample tube 102, and a relay member 116 is disposed under the rotation mechanism 108. The sample unit 100 is not in contact with the rotation mechanism 108 or the relay member 116.

In the second embodiment, similar to the first embodiment, the bearing mechanism 110 is operated to center the sample unit during the loading process. The bearing gas may be thus sprayed to the member that holds the sample tube 102, rather than directly to the sample tube 102, thereby achieving the working effect similar to the first embodiment. The inner diameter of the holder may be varied in accordance with the outer diameter of the sample tube, with the outer diameter of the holder being maintained. This configuration enables a single rotation mechanism to be shared by different types of sample tubes.

The invention claimed is:

1. A system for centering a sample tube for use with an NMR measurement system comprising:
   a sample unit including a sample tube, the sample unit configured to be placed in a passage;
   an NMR detection coil disposed adjacent to the sample unit which is inserted into the passage;
   a bearing mechanism configured to spray gas toward the passage along a direction orthogonal to a center axis of the passage, from around the passage, the bearing mechanism being disposed above the NMR detection coil;
   a controller configured to operate the bearing mechanism in a loading process of inserting the sample unit into the passage from above the passage; and
   a drive mechanism configured to apply a rotation drive force to the sample unit,
   wherein, in the loading process, while the bearing mechanism is spraying the gas, the sample unit is inserted into the bearing mechanism,
   wherein the controller is configured to operate the drive mechanism and the bearing mechanism during a rotating measurement process after the loading process, and
   wherein the controller is configured to:
   establish, during the loading process, a first flow rate as a flow rate of gas supplied to the bearing mechanism, and
   establish, during the rotating measurement process, a second flow rate that is greater than the first flow rate as the flow rate of gas supplied to the bearing mechanism.

2. The system according to claim 1, further comprising:
   a drive mechanism configured to apply a rotation drive force to the sample unit, wherein
   the controller is configured to operate the bearing mechanism without operating the drive mechanism, during a non-rotating measurement process after the loading process.

3. The system according to claim 1, wherein
   during the loading process, gas is sprayed from a plurality of openings toward a center axis of the sample unit to thereby center the sample unit.

4. The system according to claim 1, wherein
   the sample unit comprises a cap attached to an upper end of the sample tube, the cap having a first conical surface facing downward,
   the NMR measurement system further comprises a drive mechanism configured to apply a rotation drive force to the sample unit, the drive mechanism having a second conical surface facing upward and opposite the first conical surface, the second conical surface having a plurality of openings through which gas is sprayed to the first conical surface to apply the rotation drive force to the first conical surface.

5. A sample tube centering method, comprising:
   operating a sample unit comprising a sample tube to descend along a passage prior to NMR measurement such that an NMR detection coil is disposed adjacent to the sample unit when the sample unit is inserted into the passage, the NMR detection coil is disposed below a bearing mechanism,
   during descending of the sample unit, spraying bearing gas from the bearing mechanism toward the passage along a direction orthogonal to a center axis of the passage to the sample unit to align a center axis of the sample tube with the center axis of the passage, and
   operating, by a controller, a drive mechanism to apply a rotation drive force to the sample unit and the bearing mechanism during a rotating measurement process after sample unit has descended,
   wherein, during the descending of the sample unit, a first flow rate is established by the controller as a flow rate of gas supplied to the bearing mechanism, and
   during the rotating measurement process, a second flow rate that is greater than the first flow rate is established by the controller as the flow rate of gas supplied to the bearing mechanism.

6. The sample tube centering method according to claim 5, wherein
   the first flow rate and the second flow rate are established independently.

* * * * *